United States Patent
Choy et al.

(10) Patent No.: US 7,542,351 B2
(45) Date of Patent: Jun. 2, 2009

(54) INTEGRATED CIRCUIT FEATURING A NON-VOLATILE MEMORY WITH CHARGE/DISCHARGE RAMP RATE CONTROL AND METHOD THEREFOR

(75) Inventors: Jon S. Choy, Austin, TX (US); David W. Chrudimsky, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 64 days.

(21) Appl. No.: 11/756,192

(22) Filed: May 31, 2007

(65) Prior Publication Data

US 2008/0298131 A1 Dec. 4, 2008

(51) Int. Cl.
*G11C 16/06* (2006.01)
(52) U.S. Cl. .......................... 365/185.25; 365/185.19; 365/185.14; 365/185.23; 365/185.26; 365/185.29; 365/185.31
(58) Field of Classification Search .......... 365/185.19, 365/185.14, 185.23, 185.25, 185.26, 185.29, 365/185.31
See application file for complete search history.

(56) References Cited

U.S. PATENT DOCUMENTS

| | | | |
|---|---|---|---|
| 5,365,121 A | 11/1994 | Morton et al. | |
| 5,687,116 A * | 11/1997 | Kowshik et al. | 365/185.03 |
| 5,872,733 A | 2/1999 | Buti et al. | |
| 7,151,695 B2 | 12/2006 | Choy et al. | |
| 2003/0122617 A1 | 7/2003 | Johnston | |
| 2006/0104121 A1* | 5/2006 | Choy et al. | 365/185.29 |
| 2007/0121382 A1* | 5/2007 | Chan et al. | 365/185.19 |

* cited by examiner

*Primary Examiner*—Hoai V Ho
*Assistant Examiner*—Jay Radke
(74) *Attorney, Agent, or Firm*—Daniel D. Hill (57) ABSTRACT

An integrated circuit (10) comprises a plurality of non-volatile memory cells (14) and a charge distribution ramp rate control circuit (11). Each memory cell of the array (12) includes a charge storage region and a plurality of terminals. The charge distribution ramp rate control circuit includes a capacitor (62,116,144) having a first plate electrode coupled to at least one terminal of the plurality of terminals, and a second plate electrode. The charge distribution ramp rate control circuit further includes a bandgap generated current source (58,106,136) for providing a reference current to determine a ramp rate of a voltage at the at least one terminal.

19 Claims, 5 Drawing Sheets

INTEGRATED CIRCUIT FEATURING A NON-VOLATILE MEMORY WITH CHARGE/DISCHARGE RAMP RATE CONTROL AND METHOD THEREFOR

BACKGROUND

1. Field

This disclosure relates generally to integrated circuits, and more specifically, to an integrated circuit featuring a non-volatile memory with charge/discharge ramp rate control and method therefor.

2. Related Art

Floating gate non-volatile memories such as erasable programmable read only memories (EPROMs), electrically erasable programmable read only memories (EEPROMs), block erasable ("flash") EEPROMs, and one time programmable read only memories (OTPROMs) are popular for many electronic applications such as automotive control, consumer products such as tapeless answering machines, and the like. In floating gate memories, the state of each memory cell is determined by the amount of charge stored on a floating gate. The floating gate is isolated from an underlying channel by a region of tunnel oxide. Typically, the floating gate transistor is programmed and erased by processes known as Fowler-Nordheim tunneling and hot carrier injection. One process that uses Fowler-Nordheim tunneling for erasing a flash memory is called "channel erase".

A typical flash memory cell manufactured using a "triple well" process may have five terminals that must be properly biased for program and erase operations: a control gate, a source, a drain, a P-well terminal, and a deep N-well terminal. An array of flash memory cells is formed in the P-well. The P-well is isolated within the deep N-well. One technique for performing a channel erase operation on the memory cells of the flash memory array involves applying a relatively high negative voltage, for example about −9 volts, to the control gate, while applying a relatively high positive voltage, for example about +9 volts, to the P-well and the deep N-well. The drain and source of the memory cell are allowed to "float", that is, the drain and source are not directly coupled to a source of potential. However, due to capacitive coupling between the five terminals around the floating gate as well as the diode formed between the drain/source and P-well, the drain and source may float no lower than a diode drop below the P-well/deep N-well voltage.

At the end of an erase operation, the voltage on the five terminals is discharged. If the terminals are allowed to discharge too quickly, an effect of discharging the relatively high negative voltage on the control gate can cause drain, source, and P-well potentials to peak at a voltage higher than 10 volts because of the capacitive coupling. The circuit may see potentials to −10 volts on the control gate due to capacitive coupling. The application of a voltage higher than 10 volts may cause the gate oxide of high voltage transistors connected to the nodes of the memory cells to break down, drain source punch through of the transistors connected to the nodes of the memory cell, or other forms of high voltage damage, thus shortening the life of the flash memory.

What would be desirable therefore are a method, and a non-volatile memory using such a method, which prevents the exposure of the high voltage transistors to high voltage beyond the reliability limits. Such a method and a non-volatile memory using that technique is provided by the embodiments of the present disclosure, whose features and advantages will be more clearly understood from the following detailed description taken in conjunction with the accompanying drawings.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero.

In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Brackets are used herein to indicate the conductors of a bus or the bit locations of a value. For example, "bus 60 [7:0]" or "conductors [7:0] of bus 60" indicates the eight lower order conductors of bus 60, and "address bits [7:0]" or "ADDRESS [7:0]" indicates the eight lower order bits of an address value. The symbol "$" preceding a number indicates that the number is represented in its hexadecimal or base sixteen form. The symbol "%" preceding a number indicates that the number is represented in its binary or base two form.

Generally, the present invention provides an integrated circuit having a memory. The memory includes an array of non-volatile memory cells. Each memory cell of the array includes a plurality of terminals comprising: a control gate, a charge storage region, a source, a drain, a well terminal, and a deep well terminal. Following an erase operation of the array, the erase voltages are discharged from each of the memory cells. As disclosed in several embodiments, a discharge rate control circuit controls the discharging of the terminals of the erased memory cell. The erase voltages are discharged at a rate in which the capacitive coupling from one of the terminals of the memory cell to other terminals of the memory cell are essentially nulled out, or minimized, for voltage overshoot. After a predetermined time, the erase voltages will be discharged to a level that is safe for devices which are connected to any of the terminals of the memory cell. In general, the discharge rate control circuit includes a reference current generator for providing a reference current; a first current mirror, coupled to the reference current generator for providing a first predetermined discharge current for discharging the control gate, drain, and source; and a second current mirror, coupled to the reference current generator, for providing a second predetermined discharge current for discharging the well terminals after the erase operation. In a preferred embodiment, all five terminals of a memory cell are recovered, or discharged, at the same time. In other embodiments, less than all of the five terminals may be discharged at the same time. Also, in another embodiment, a discharge circuit is described that recovers the negative voltage against some of the positive voltages that are on the source and drain. This eliminates the need to use charge from other positive power supplies.

Controlling the discharge rate using the discharge rate control circuit in accordance with the illustrated embodiments prevents transistors that are coupled to the memory cells from being damaged because they are exposed to a voltage higher than the reliability limits of the transistors.

Figure 1:
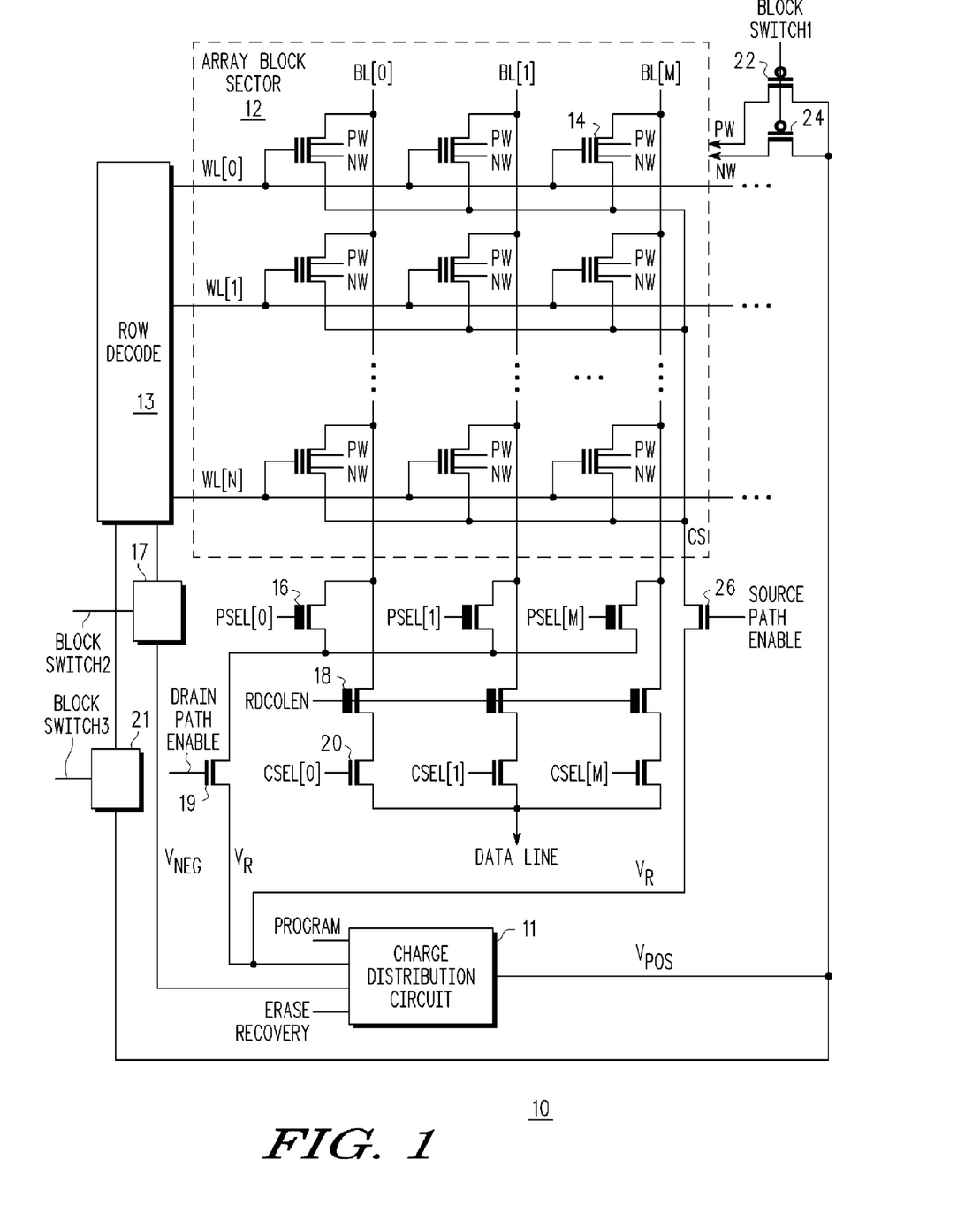
FIG. 1 illustrates, in schematic diagram form, a portion of a non-volatile memory according to one embodiment of the present disclosure.

FIG. 1 illustrates, in schematic diagram form, a portion of a non-volatile memory 10 in accordance with the present invention. Non-volatile memory 10 is implemented on an integrated circuit and includes an array 12 of non-volatile memory cells coupled at the intersections of word lines and bit lines. Array 12 includes N word lines, where N is an integer, represented by word lines labeled WL[0], WL[1], and WL[N]. Array 12 includes M bit lines, where M is an integer, represented by bit lines labeled BL[0], BL[1], and BL[M]. A non-volatile memory cell 14 is illustrative of the memory cells of the array and includes a control gate coupled to the word line WL[0], a drain coupled to bit line BL[M], a floating gate, a P-well terminal labeled "PW" and a deep N-well terminal labeled "NW". The well terminal PW is coupled to a P-well region of a semiconductor substrate on which the integrated circuit is implemented. Source terminals of all of the memory cells of the array are coupled together and labeled "CS". In the illustrated embodiment, array 12 is a flash memory and is manufactured using a conventional triple-well process and includes a deep N-well for isolating the array. The deep N-well surrounds the P-well within the semiconductor substrate. In another embodiment, the array 12 may be manufactured using a different process that does not include a deep N-well. Also, in another embodiment, the conductivity types of the wells may be different. In addition, the array 12 of the illustrated embodiment includes floating gate transistors. In another embodiment, the array 12 may include another non-volatile memory cell type, such as for example, a SONOS structure where a charge storage layer may include, for example, nitride, nanocrystals, or a combination of nitride and nanocrystals. In addition, the non-volatile memory 10 may be implemented on an integrated circuit as a stand-alone memory, or may be implemented with other circuitry, such as for example, in a microprocessor, or in a microcontroller having a central processing unit (CPU) and one or more peripheral circuits.

A row decoder 13 is coupled to all of the word lines of the array 12. Row decoder 13 is a conventional row decoder and is for selecting one or more word lines, depending on the type of access operation, in response to receiving a row address. A program select transistor is coupled to each of the bit lines and receives one of a decoded program select signal labeled PSEL[0], PSEL[1], and PSEL[M]. For example, a program select transistor 16 has a drain coupled to the bit line BL[0], a gate coupled to receive the program select signal PSEL[0], and a source coupled to the drain of an N-channel transistor 19. Because the N-channel transistors 16, 18 and 19 are exposed to relatively high voltages during program and erase operations, they are implemented using a high voltage CMOS (complementary metal-oxide semiconductor) process as indicated by the thickly drawn gate in FIG. 1. The transistors not exposed to the high program and erase voltages are implemented with thinner gate oxides. Transistors 18 are coupled between the program select transistors and the N-channel column select transistors 20 are for isolating the column select transistors 20 from the relatively higher program and erase voltages. Transistors 18 are always enabled during a read operation and serve as a high voltage isolation device for thinner oxide transistors during program and erase and may not be necessary in other embodiments. Each of the column select transistors, such as transistor 20, is for coupling a corresponding bit line to a data line in response to an asserted one of the column select signals CSEL[0], CSEL[1], and CSEL[M]. In the illustrated embodiment, sense amplifiers (not shown) are coupled to the data lines and are shared between a predetermined number of bit lines. The sense amplifiers are for sensing and amplifying the relatively small currents conducting through the bit lines.

A charge distribution circuit 11 is provided for enabling charge rate control and discharge rate control. In particular, charge distribution circuit 11 provides charge/discharge rate control configured (i) to charge the voltages on the terminals of the non-volatile memory cells for a program operation and (ii) to discharge the voltages on the terminals of the non-volatile memory cells after an erase operation. The charge distribution circuit 11 has a first conductor labeled VNEG coupled to the row decoder 13 through the negative block switch 17, and a second conductor labeled VR coupled to the source terminals of the program select transistors through an N-channel transistor 19 that is activated with a signal labeled "DRAIN PATH ENABLE". The negative block switch 17 receives an enable signal labeled "BLOCK SWITCH 2". The second conductor is also coupled to the common source CS of array 12 via an N-channel transistor 26 when a signal labeled "SOURCE PATH ENABLE" is asserted. In addition, the charge distribution circuit 11 includes a third conductor labeled VPOS coupled to the P-well terminal and the deep N-well terminal via P-channel transistors 22 and 24 in response to a signal labeled "BLOCK SWITCH 1" being asserted. Note that the conductivity type of the illustrated transistors is not important for purposes of describing the invention, and may be different in other embodiments. Also, the transistors 22 and 24 may be separately controlled in other embodiments.

Further in connection with the charge distribution circuit 11, the third conductor VPOS is also coupled to the row decoder 13 through the positive block switch 21. The positive block switch 21 receives an enable signal labeled "BLOCK SWITCH 3". The charge distribution circuit 11 also has fourth and fifth conductors, for receiving signals labeled "PROGRAM" and "ERASE RECOVERY", respectively. The charge distribution circuit 11 operates to charge the voltages on the terminals of the non-volatile memory cells in a desired ramp rate controlled manner for a program operation in response to a PROGRAM enable signal being asserted. In addition, the charge distribution circuit 11 operates to discharge the voltages on the terminals of the non-volatile memory cells in a desired ramp rate controlled manner after an erase operation in response to an ERASE RECOVERY enable signal being asserted.

The memory array 12 is programmed using a hot carrier injection (HCI) program operation. Briefly, during a HCI program operation approximately 9 v is applied to the control gate of the bitcell. This is accomplished by coupling the $V_{POS}$ supply through BLOCK SWITCH1. And simultaneously a drain voltage of approximately 5V is applied to the drain of the bitcell through the PSEL devices 16. The drain voltage is not depicted in this diagram as this invention focuses on the application of the control gate during program. The operation of various embodiments of the charge distribution circuit will be discussed in more detail below.

The memory array 12 is erased using a channel erase operation. A relatively high negative voltage, for example about −9 volts, is applied to the control gate of each of the memory cells of the array, while applying a relatively high positive voltage, for example about +9 volts, is applied to the P-well and the deep N-well. The drain and source are allowed to "float" no lower than a diode drop below the P-well, that is, the drain and source are not directly coupled to a source of potential. However, due to capacitive coupling between the five terminals around the floating gate and charging through the junction from the P-well to the drain and source, the drain and source float at a diode drop below the P-well/deep N-well voltage. These voltages are applied to the array 12 for a predetermined amount of time. In other embodiments, the erase voltages may be different and may be applied to different terminals of the memory cells depending on the erase mechanism used.

After the erase operation, it is necessary to discharge the erase voltages from the memory array 12. To prevent high voltage damage to transistors connected to the nodes of the memory cell, the charge distribution circuit 11 causes the high (or low) negative erase voltage on the gate and the high positive erase voltage on the wells, drains and sources, to be discharged at a rate which will suppress coupling voltage higher than 10V on any of the five terminals from any of the other five terminals. Because the array 12 is a flash memory in the illustrated embodiment, all of the transistors of array 12 are erased at the same time. Likewise, the erase voltages are discharged from all of the transistors at the same time. In one embodiment, array 12 may represent the entire memory array. In other embodiment, array 12 may represent only one of two or more blocks, or sectors, of a non-volatile memory array. The operation of various embodiments of the charge distribution circuit 11 will be described in more detail below.

Figure 2:
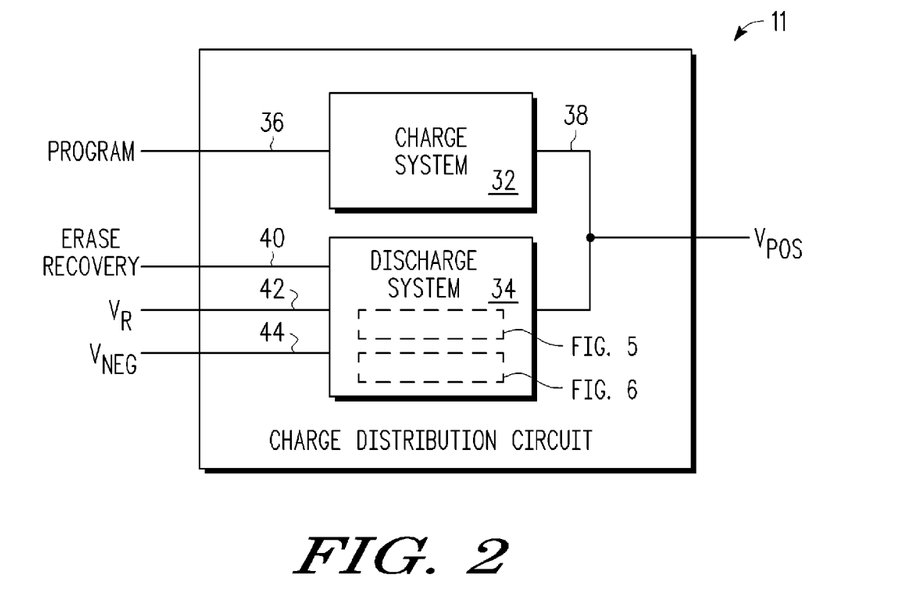
FIG. 2 illustrates, in block diagram form, a charge distribution circuit portion of the non-volatile memory of FIG. 1 in greater detail, including a charge system and a discharge system.

FIG. 2 illustrates, in block diagram form, the charge distribution circuit 11 of the non-volatile memory 10 of FIG. 1 in greater detail, including a charge system 32 and a discharge system 34. Note that throughout the drawings, the same reference numbers will be used for the same or similar elements. Charge system 32 includes an input signal line 36 and an output signal line 38. As indicated above, charge distribution circuit 11 operates to charge the voltages on the terminals of the non-volatile memory cells in a desired ramp rate controlled manner for a program operation in response to a PROGRAM enable signal being asserted. In particular, the PROGRAM enable signal is asserted on signal line 36. Responsive to an assertion of the PROGRAM signal on input 36, charge system 32 provides a signal $V_{POS}$ on output 38.

Discharge system 34 includes signal lines 38, 40, 42 and 44, as will be discussed further below. As indicated herein above, the charge distribution circuit 11 operates to discharge the voltages on the terminals of the non-volatile memory cells in a desired ramp rate controlled manner after an erase operation in response to an ERASE RECOVERY enable signal being asserted. In particular, the ERASE RECOVERY signal is asserted on signal line 40. In addition, the voltage on $V_{POS}$ is provided on signal line 38. Responsive to an assertion of the ERASE RECOVERY signal on input 40, discharge system 34 provides a signal $V_R$ on output 42 and a signal $V_{NEG}$ on output 44.

Figure 3:
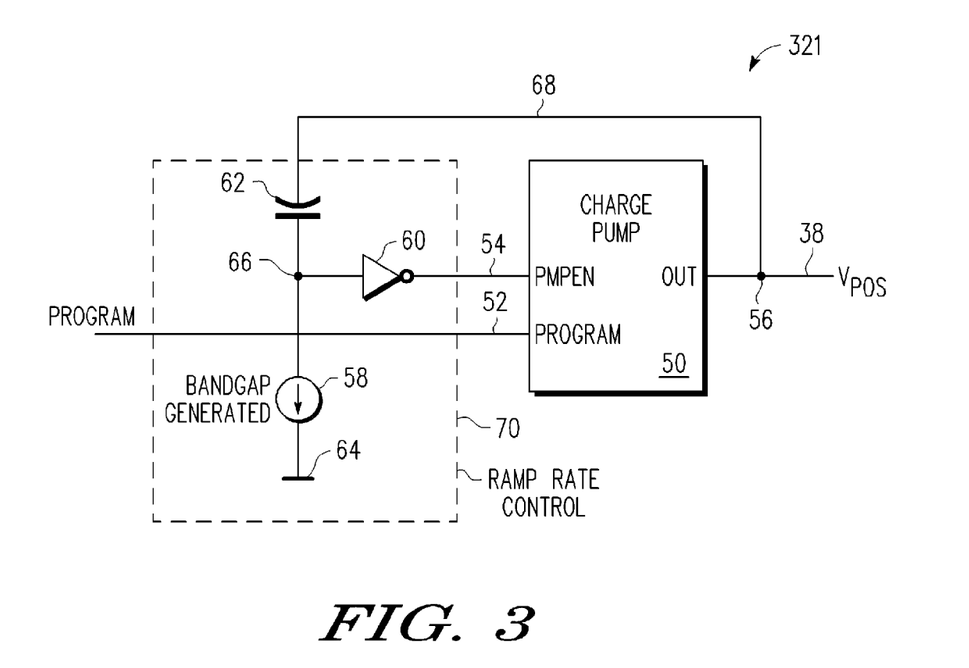
FIG. 3 illustrates, in schematic diagram form, the charge system of the charge distribution circuit of FIG. 2, according to one embodiment.

FIG. 3 illustrates, in schematic diagram form, the charge system 32 of the charge distribution circuit 11 of FIG. 2, according to one embodiment, the embodiment being indicated by reference numeral 321 in FIG. 3. The charge system 321 includes a charge pump 50 having a program input 52 (indicated by "PROGRAM"), a pump enable input 54 (indicated by the acronym "PMPEN"), and an output 56 (indicated by "OUT"). In addition, the output 56 is coupled to the output 38 ($V_{POS}$). Furthermore, the PROGRAM signal provided on signal line 36 is coupled to the program input 52 of charge pump 50.

The charge system 321 further includes a bandgap generated current source 58, an inverter 60, and a feedback capacitor 62. The bandgap generated current source 58 is electrically coupled between a node terminal 64 and an input 66 of inverter 60. In one embodiment, bandgap generated current source 58 produces a bandgap current reference on the order of approximately 10 µA. In addition, terminal 64 is electrically coupled to ground potential. In another embodiment, terminal 64 is electrically coupled to a negative potential. Feedback capacitor 62 is electrically coupled between the input 66 of inverter 60 and the output 56 of charge pump 50 via feedback signal line 68. During operation of the charge system 321, a displacement current flows through feedback capacitor 62. In addition, the bandgap generated current source 58, inverter 60, and feedback capacitor 62 collectively form a charge system ramp rate control 70. Furthermore, in one embodiment, inverter 60 is implemented as a comparator.

In operation, the charge pump 50 which is also appropriately named a voltage multiplier can generate a voltage potential that is greater than the chip's Vcc supply (for example about 3V). The PMPEN 54 active high allows an internal free running clock to propagate to the charge pump circuit and in turn pump the output to a higher voltage. In this implementation, the high voltage can be approximately 9V. If the PMPEN 54 is low, then the charge pump is disabled by not allowing an internal clock to propagate to the charge pump. There are various embodiments of charge pumps that are able to achieve voltages much greater than $V_{CC}$ or much less than $V_{SS}$ which is ground.

The Ramp Rate Control 70 compares the displacement current through capacitor 62 to the bandgap generated current 58. The displacement current is created due to the changing $V_{POS}$ voltage. When the displacement current is greater than the bandgap generated current, node 66 is driven high and causes PMPEN 54 to be driven low through inverter 60. This stops the pump from pumping and hence slows down the charging of $V_{POS}$. If the displacement current is less than the bandgap generated current, then node 66 is pulled low and inverter 60 drives pmpen high. This again enables pumping and the charging of $V_{POS}$ is increased. Hence, Ramp Rate Control 70 controls the ramp rate of $V_{POS}$.

Figure 4:
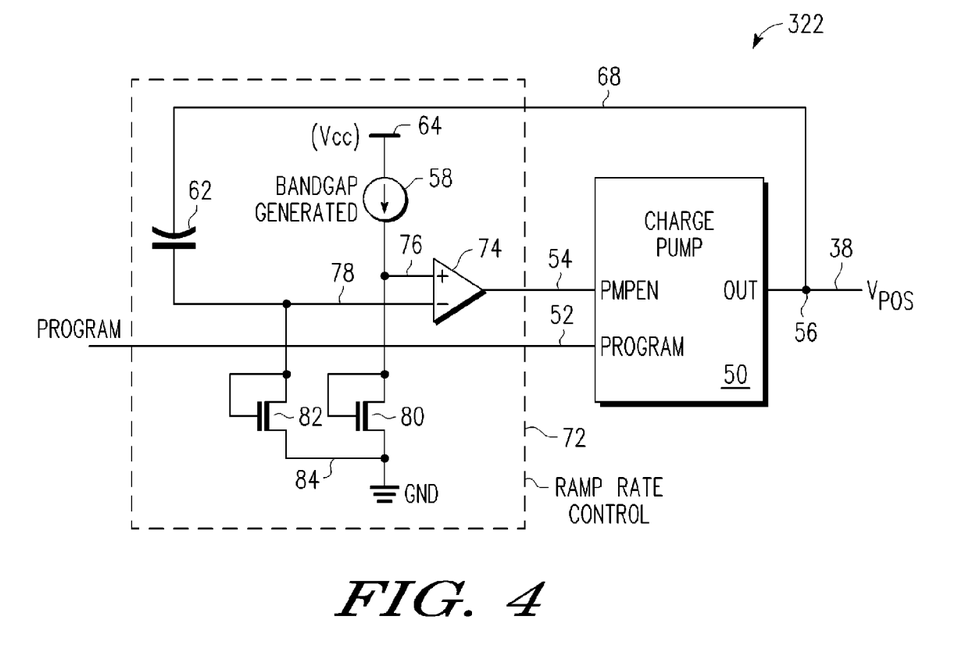
FIG. 4 illustrates, in schematic diagram form, the charge system of the charge distribution circuit of FIG. 2, according to another embodiment.

FIG. 4 illustrates, in schematic diagram form, the charge system 32 of the charge distribution circuit 11 of FIG. 2, according to another embodiment, the embodiment being indicated by reference numeral 322 in FIG. 4. The charge system 322 includes a charge pump 50 having a program input 52 (indicated by "PROGRAM"), a pump enable input 54 (indicated by the acronym "PMPEN"), and an output 56 (indicated by "OUT"). In addition, the output 56 is coupled to the output 38 ($V_{POS}$). Furthermore, the PROGRAM signal provided on signal line 36 is coupled to the program input 52 of charge pump 50.

The charge system 322 further comprises a ramp rate control circuit 72, the ramp rate control circuit 72 collectively including bandgap generated current source 58, differential comparator 74, feedback capacitor 62, and transistors 80 and 82. The bandgap generated current source 58 is electrically coupled between a terminal 64 and a non-inverting input 76 of differential comparator 74. In one embodiment, bandgap generated current source 58 produces a bandgap current reference on the order of approximately 10 µA. In addition, terminal 64 is electrically coupled to $V_{CC}$. Differential comparator 74 also includes an inverting input 78 and an output. The output of comparator 74 is coupled to pump enable input 54 of charge pump 50.

Feedback capacitor 62 is electrically coupled between inverting input 78 of differential comparator 74 and output 56 of charge pump 50 via feedback signal line 68. During operation of the charge system 322, a displacement current flows through feedback capacitor 62. In addition, transistors 80 and 82 are matched N-channel transistors. The source of transistor 80 is coupled to terminal 84 which is $V_{SS}$ or ground and the drain is coupled to the non-inverting terminal 76 of differential comparator 74. The gate of transistor 80 is coupled to its drain in a gate diode connected transistor configuration. In addition, the source of transistor 82 is coupled to terminal 84 and the drain of transistor 82 is coupled to the inverting input 78 of differential comparator 74. The gate of transistor 82 is coupled to its drain in a gate diode connected transistor configuration.

In operation, the differential comparator 74 compares two voltages of the drain of two n-channel devices 82 and 80 respectively. In this example the two N-channel transistors are identical; but does not necessarily have to be the case. The displacement current in capacitor 62 is compared against the bandgap generated current 58. Due to negative feedback in this system, the comparator will enable and disable the pump appropriately to force terminal voltages 76 and 78 to be the same. The negative feedback occurs because as the ramp rate slows down, the voltage at 78 lowers and if it is below terminal 76 it will enable the pump. Similarly if it is higher than 76, it will disable the pump.

Figure 5:
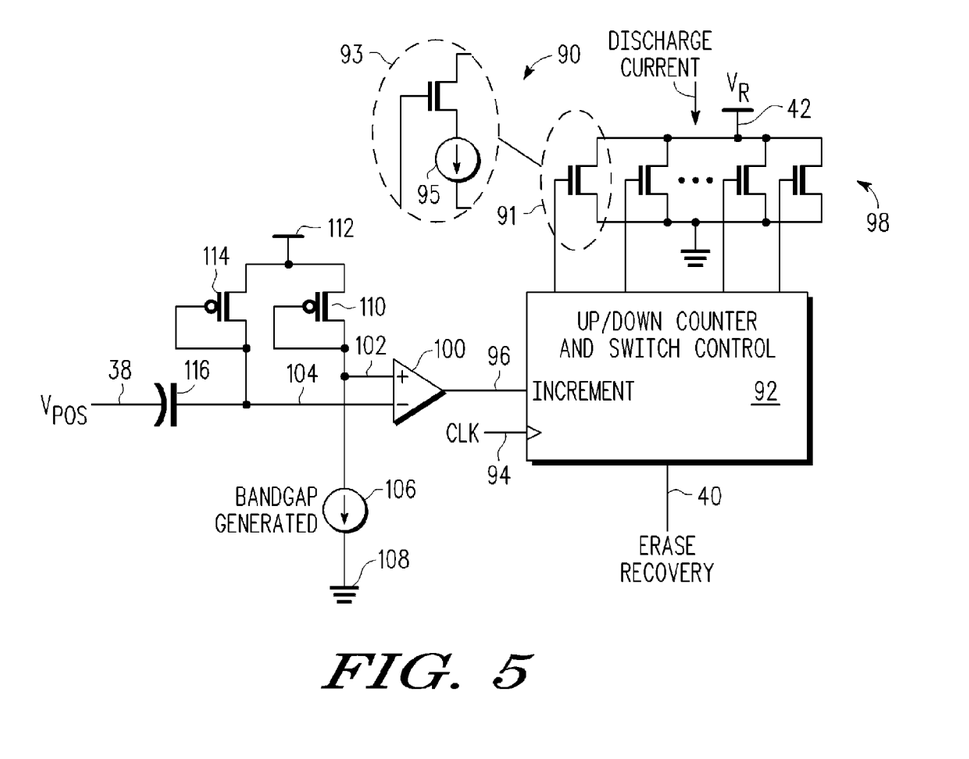
FIG. 5 illustrates, in schematic diagram form, a portion of the discharge system of the charge distribution circuit of FIG. 2, according to one embodiment.

FIG. 5 illustrates, in schematic diagram form, a positive discharge path portion 90 of the discharge system 34 of the charge distribution circuit 11 of FIG. 2, according to one embodiment. The portion 90 of discharge system 34 includes an up/down counter and switch control circuit 92 having an ERASE RECOVERY input 40, a clock input 94 (indicated by the acronym "CLK"), and an increment input 96 (indicated by "Increment"). In addition, up/down counter and switch control circuit 92 is coupled to a bank of switches 98, wherein the bank of switches 98 includes a number of parallel coupled N-channel transistor devices 91. In particular, the up/down counter and switch control circuit 92 couples to the gate terminals of the parallel coupled N-channel transistor devices 91. The number of parallel coupled N-channel transistors 91 of bank 98 is chosen to be at least a number that is more than sufficient to recover voltage in a predetermined range, i.e., sufficient enough to be beyond a steady state level for a given load and application. In other words, the total number of switches is selected to be sufficient for a worst case scenario. The drain terminals of the N-channel transistors 91 of the bank of switches 98 are coupled to the recovery voltage $V_R$ on signal line 42. The source terminals of the N-channel transistors 91 of the bank of switches 98 are electrically coupled to ground potential.

The positive path discharge portion 90 of discharge system 34 further comprises a differential comparator 100, a bandgap generated current source 106, P-channel transistors 110 and 114, and a capacitor 116. Differential comparator 100 includes a non-inverting input 102, an inverting input 104, and an output. The output of the differential comparator 100 is coupled to the increment input 96 of the up/down counter and switch control circuit 92. The bandgap generated current source 106 is electrically coupled between a terminal 108 and the non-inverting input 102 of differential comparator 100. In one embodiment, bandgap generated current source 106 produces a bandgap current reference on the order of approximately 10 µA. In addition, terminal 108 is electrically coupled to ground potential. In another embodiment, terminal 108 is electrically coupled to a negative potential.

Transistors 110 and 114 comprise matched P-channel transistors. The source of transistor 110 is coupled to terminal 112 and the drain terminal of transistor 110 is coupled to the non-inverting input 102 of differential comparator 100. The gate of transistor 110 is coupled to its drain in a gate diode connected transistor configuration. In addition, the source of transistor 114 is coupled to terminal 112 and the drain of transistor 114 is coupled to the inverting input 104 of differential comparator 100. The gate of transistor 114 is coupled to its drain in a gate diode connected transistor configuration. Capacitor 116 is electrically coupled between inverting input 104 of differential comparator 100 and output 38 ($V_{POS}$) of discharge system 34. During operation of the discharge system 34, a displacement current flows through capacitor 116.

In operation, current flows through the bank of switches 98 that is representative of a discharge current for the positive path discharge portion 90 of the discharge system 34. Up/down counter and switch control circuit 92 is configured for controlling a switching of the N-channel transistors 91 of the bank of switches 98, according to a given discharge current ramp rate, as will be discussed further herein. In an alternate embodiment, one or more of the N-channel transistors 91 may comprise an N-channel transistor 93 having a scaleable current source 95 coupled between the source terminal of the corresponding transistor and ground potential.

Scalable current source 95 is configured according to the requirements of a particular discharge system implementation to better control a corresponding discharge current over temperature, process technology, and voltage. In some embodiments the scalable current may be a function of memory array block size as to give the feedback loop a good starting point for feedback convergence.

In addition, the displacement current through capacitor 116 in the discharge system 90 is compared against a bandgap generated current 106. Both the capacitor and the bandgap current have the same load in this embodiment, a p-channel 110,114. The ratio of current to load is converted to voltage for both terminals of the differential comparator. If the non-inverting node 104 has a higher voltage potential than the inverting node 102, then the comparator generates a signal that is the full supply rail $V_{CC}$ at output 96. This enables the counter 92 to increment and increases the discharge current proportional or in a binary weighted manner depending on the embodiment. Similarly if the non-inverting node 104 falls below the inverting node terminal 102, then the output of the comparator 100 is driven to the lowest potential of the comparator which in this case is ground. This enables the counter 92 to decrement and decreases the discharge current proportional or in a binary weighted manner depending on the embodiment Therefore by negative feedback a predetermined rate determined by the size of capacitor 116 and the bandgap generated current 106 sets the positive voltage $V_{POS}$ 38 recovery rate. In non-volatile memory 10 of FIG. 1, the $V_{POS}$ supply is coupled to VR through transistors 22, 26, 16, and 19 via the bitcell junctions that are forward biased to the P-well. Referring again to FIG. 5, the Discharge Current being pulled from VR, then, recovers the $V_{POS}$ voltage to a safe value at the rate specified by discharge path 90. Recovery of $V_{POS}$ through VR begins at the activation of the ERASE RECOVERY signal 40.

Figure 6:
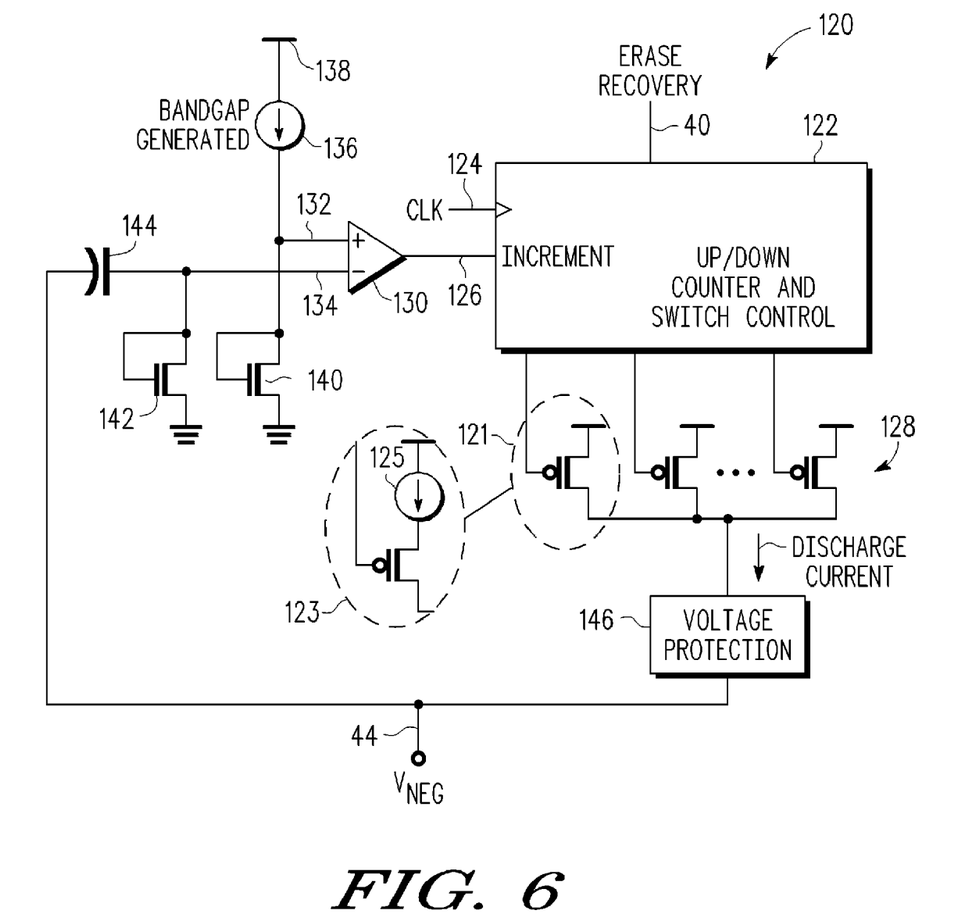
FIG. 6 illustrates, in schematic diagram form, another portion of the discharge system of the charge distribution circuit of FIG. 2, according to one embodiment.

FIG. 6 illustrates, in schematic diagram form, another portion 120 of the discharge system of the charge distribution circuit 11 of FIG. 2, according to one embodiment. In particular, portion 120 represents a negative discharge path portion of the discharge system 34. Negative discharge path portion 120 of discharge system 34 includes an up/down counter and switch control circuit 122 having an ERASE RECOVERY input 40, a clock input 124 (indicated by the acronym "CLK"), and an increment input 126 (indicated by "Increment"). In addition, up/down counter and switch control circuit 122 is coupled to a bank of switches 128, wherein the bank of switches 128 includes a number of parallel coupled P-channel transistor devices 121. In particular, the up/down counter and switch control circuit 122 couples to the gate terminals of the parallel coupled P-channel transistor devices 121. The number of parallel coupled P-channel transistors 121 of bank 128 is chosen to be at least a number that is more than sufficient to recover voltage in a predetermined range, i.e., sufficient enough to be beyond a steady state level for a given load and application. In other words, the total number of switches is selected to be sufficient for a worst case scenario. The source terminals of the P-channel transistors 121 of the bank of switches 128 are electrically coupled to a supply rail $V_{CC}$ 138. The drain terminals of the P-channel transistors 121 of the bank of switches 128 are electrically coupled to a terminal (e.g., output) of a voltage protection circuit 146. Voltage protection circuit 146 comprises, for example, a number of transistors in series that are configured for protecting the bank 128 of P-channel transistors from encountering any detrimental over-voltage conditions. Voltage protection circuit 146 has another terminal (e.g., input) coupled to the $V_{NEG}$ signal line 44 of discharge system 34 of FIG. 2.

The negative path discharge portion 120 of discharge system 34 further comprises a differential comparator 130, a bandgap generated current source 136, N-channel transistors 140 and 142, and a capacitor 144. Differential comparator 130 includes a non-inverting input 132, an inverting input 134, and an output. The output of the differential comparator 130 is coupled to the increment input 126 of the up/down counter and switch control circuit 122. The bandgap generated current source 136 is electrically coupled between Vcc 138 and the non-inverting input 132 of differential comparator 130. In one embodiment, bandgap generated current source 136 produces a bandgap current reference on the order of approximately 10 µA.

Transistors 140 and 142 comprise matched N-channel transistors. The source of transistor 140 is coupled to ground potential and the drain terminal of transistor 140 is coupled to the non-inverting input 132 of differential comparator 130. The gate of transistor 140 is coupled to its drain in a gate diode connected transistor configuration. In addition, the source of transistor 142 is coupled to ground potential and the drain of transistor 142 is coupled to the inverting input 134 of differential comparator 130. The gate of transistor 142 is coupled to its drain in a gate diode connected transistor configuration. Capacitor 144 is electrically coupled between inverting input 134 of differential comparator 130 and output 44 ($V_{NEG}$) of discharge system 34. During operation of the discharge system 34, a displacement current flows through capacitor 144.

In operation, current flows through the bank of switches 128 that is representative of a discharge current for the negative path discharge portion 120 of the discharge system 34. Up/down counter and switch control circuit 122 is configured for controlling a switching of the P-channel transistors 121 of the bank of switches 128, according to a given discharge current ramp rate, as will be discussed further herein. In an alternate embodiment, one or more of the P-channel transistors 121 may comprise a P-channel transistor 123 having a scaleable current source 125 coupled between the drain terminal of the corresponding transistor and full rail supply $V_{CC}$ 138. Scalable current source 125 is configured according to the requirements of a particular discharge system implementation to better control a corresponding discharge current over temperature, process technology, and voltage.

In operation, the $V_{NEG}$ voltage is applied typically in an Erase operation where approximately −9V can be applied to $V_{NEG}$ 44. Once the operation is complete, an erase recovery signal 40 is enabled to begin the voltage recovery process with the circuit described above. The differential comparator 130 forces the voltages at terminals 132 and 134 to be equal due to negative feedback in the system. The displacement current in capacitor 144 is weighed against a gated-diode N-channel transistor 142. An identical N-channel transistor 140 for example is weighed against a bandgap generated current. The displacement current in capacitor 144 must match the bandgap generated current 136 or it will be reflected in a voltage disparity at terminals 132 and 134. If the voltage at terminal 134 falls below terminal 132, then the comparator 130 will increment the counter and thereby increase the recovery current. Similarly, if the voltage at terminal 134 is lower than terminal 132, then the comparator will decrement the counter 122 and decrease the current. This negative feedback forces a predetermine rate defined by the capacitor size and bandgap current reference.

Figure 7:
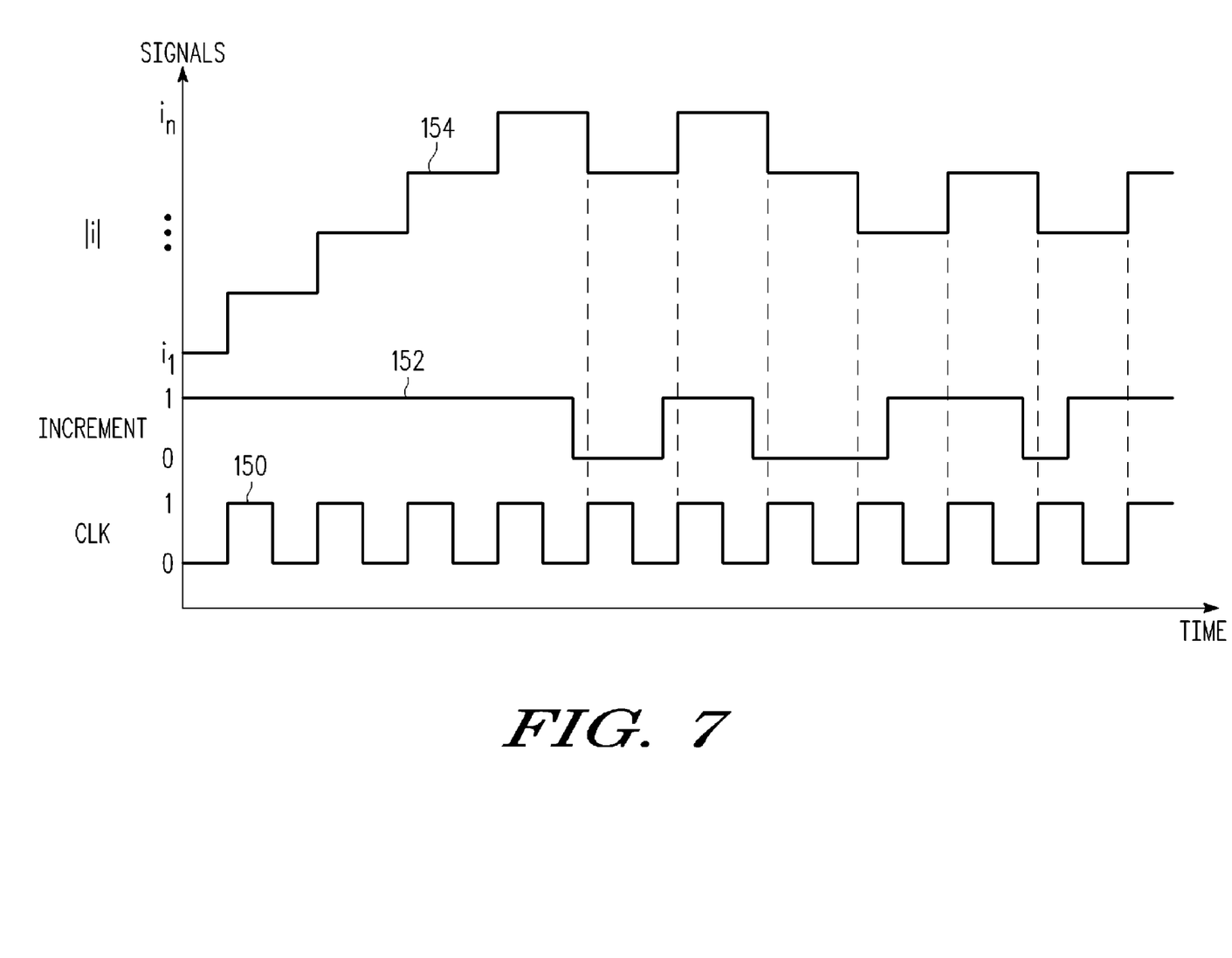
FIG. 7 illustrates, in timing diagram form, an example of an absolute value or magnitude of discharge current generated in response to incremental control via increment and clock input signals to a corresponding up/down counter and switch controller of the respective portions of the discharge system of FIGS. 5 and 6.

FIG. 7 illustrates, in timing diagram form, an example of an absolute value or magnitude of discharge current generated in response to incremental control via increment and clock input signals to a corresponding up/down counter and switch controller of the respective portions 90 and 120 of FIGS. 5 and 6 of the discharge system 34 of FIG. 2. In the timing diagram, time is represented on the horizontal axis. The vertical axis includes clock signal CLK, increment signal INCREMENT, and the absolute value or magnitude of discharge current |i|. Clock signal CLK alternates at a given frequency between a 0 state and a 1 state, as illustrated by signal 150. The INCREMENT signal can have a 0 state or a 1 state, as illustrated by signal 152. The INCREMENT signal is determined as a function of a reference current provided by a bandgap generated current source to determine a ramp rate of a voltage at a plurality of terminals of a plurality of non-volatile memory cells. In addition, the absolute value of the discharge current |i| can vary in value from a first current magnitude, represented by the symbol "$i_1$", and another current magnitude, represented by the symbol "$i_n$". The value "n" of current "$i_n$" is a value that is determined as a function of the number of parallel switches contained within the bank of switches 98, 128 being controlled according to the requirements of a load being discharge via the discharge system 34. In other words, the load that is being discharged may comprise a varying load. Accordingly, the embodiments of the present disclosure advantageously provide for non-volatile memory array implementations in which the discharge load comprises a varying load.

Referring still to FIG. 7, in the example illustrated, the increment signal 152 is shown to have a "1" state asserted to the left-hand side of the figure. During the assertion of the "1" state of the increment signal, the absolute value or magnitude of the discharge current |i| increments an incremental amount at each occurrence of a "0" to "1" transition of the clock signal CLK. In contrast, during the assertion of the "0" state of the increment signal 152, the absolute value of the discharge current |i| decrements by an incremental amount at each occurrence of a "0" to "1" transition of the clock signal CLK. Thus, as illustrated, the absolute value of the discharge current |i| starts out with a value corresponding to a first current magnitude, as represented by the symbol "$i_1$". At the occurrence of each "0" to "1" clock transition while increment signal 152 is still in the "1" state, the discharge current 154 increments to higher magnitudes.

Subsequently, the increment signal 152 changes state, from a "1" to "0"; however, note that the magnitude of the discharge current 154 does not immediately decrement. Instead, upon the occurrence of a later occurring "0" to "1" clock transition while increment signal 152 is still in the "0" state, the discharge current 154 decrements to a lower magnitude. In following along in the example of FIG. 7, after the occurrence of the first decrement of discharge current 154, the increment signal 152 again changes state, from a "0" to "1". Note that the discharge current 154 does not increment immediately but increments at the occurrence of the subsequent occurring "0" to "1" clock transition by clock signal 150. Discharge current 154 thereafter continues to increment and/or decrement as a function of the state of the increment signal 152 and the clock signal 150.

By now it should be appreciated that there has been provided an integrated circuit comprising a plurality of non-volatile memory cells and a ramp rate control circuit. Each memory cell of the array includes a charge storage region and a plurality of terminals. The ramp rate control circuit includes a capacitor having a first plate electrode coupled to at least one terminal of the plurality of terminals, and a second plate electrode. The ramp rate control circuit further includes a bandgap generated current source for providing a reference current to determine a ramp rate of a voltage at the at least one terminal.

In one embodiment, the at least one terminal comprises a control gate, and the voltage is provided by a charge pump during a programming operation of the plurality of non-volatile memory cells.

In another embodiment, the voltage is discharged from the at least one terminal at the ramp rate, wherein the voltage is discharged following an erase operation of the plurality of non-volatile memory cells.

In a further embodiment, the ramp rate control circuit is coupled to control one of either a charge system or a discharge system, wherein the charge system includes a charge pump for providing the voltage to the at least one terminal at the ramp rate, and wherein the discharge system includes an up/down counter and switch control configured for discharging the at least one terminal at the ramp rate.

Still further, in another embodiment, the ramp rate control circuit further comprises an inverter. The inverter includes an input terminal coupled to both the bandgap generated current source and to the second plate electrode of the capacitor. The inverter also includes an output terminal coupled to a terminal of a charge pump, the charge pump for providing the voltage at the ramp rate.

In a yet another embodiment, the ramp rate control circuit further comprises: a first transistor, a second transistor, and a comparator. The first transistor includes a first current electrode coupled to a first power supply voltage terminal, and a second current electrode coupled to the bandgap generated current source. The second transistor includes a first current electrode coupled to the first power supply voltage terminal, and a second current electrode. Lastly, the comparator includes a first input coupled to the second current electrode of the first transistor, a second input coupled to both the second current electrode of the second transistor and to the second plate electrode of the capacitor, and an output terminal coupled to a terminal of a charge pump for providing the voltage at the ramp rate.

In another embodiment, the ramp rate control circuit further comprises: a first transistor, a second transistor, a comparator, a counter circuit, and a discharge circuit. The first transistor includes a first current electrode coupled to a first power supply voltage terminal, and a second current electrode coupled to the bandgap generated current source. The second transistor includes a first current electrode coupled to the first power supply voltage terminal, and a second current electrode. The comparator includes a first input coupled to the second current electrode of the first transistor, a second input coupled to both the second current electrode of the second transistor and to the second plate electrode of the capacitor, and an output terminal. The counter circuit includes a control terminal coupled to the output terminal of the comparator, and a plurality of output terminals for providing a count value. The discharge circuit is coupled to the plurality of output terminals of the counter circuit, the discharge circuit for reducing the voltage at the ramp rate. The discharge circuit further comprises a plurality of transistors, each of the plurality of transistors coupled to a corresponding one of the plurality of output terminals, wherein a current carrying ability of the plurality transistors is proportional to the count value.

In the integrated circuit as discussed herein, the plurality of terminals can comprise a control gate, a drain, a source, and a well terminal. In addition, in the integrated circuit as discussed herein, the charge storage region can comprise one of a floating gate, nitride, nanocrystals, and a combination of nitride and nanocrystals.

In a further embodiment, an integrated circuit comprises a plurality of non-volatile memory cells, a charge pump, and a ramp rate control circuit. Each memory cell of the plurality or array of non-volatile memory cells includes a charge storage region and a plurality of terminals. The charge pump includes an output terminal coupled to at least one of the plurality of terminals of a desired memory cell, the charge pump for providing a predetermined voltage during a programming operation of the plurality of non-volatile memory cells.

The ramp rate control circuit comprises a capacitor and a bandgap generated current source. The capacitor includes a first plate electrode coupled to the at least one terminal of the plurality of terminals, and a second plate electrode. The bandgap generated current source is configured for providing a reference current to determine a ramp rate of the predetermined voltage at the at least one terminal. The ramp rate control circuit further comprises an inverter, wherein the inverter includes an input terminal and an output terminal. The inverter input terminal couples to both the bandgap generated current source and to the second plate electrode of the capacitor, and the inverter output terminal couples to a terminal of the charge pump.

In another embodiment, the ramp rate control circuit further comprises a first transistor, a second transistor, and a comparator. The first transistor includes a first current electrode coupled to a first power supply voltage terminal, and a second current electrode coupled to the bandgap generated current source. The second transistor includes a first current electrode coupled to the first power supply voltage terminal, and a second current electrode. Lastly, the comparator includes a first input coupled to the second current electrode of the first transistor, a second input coupled to both the second current electrode of the second transistor and to the second plate electrode of the capacitor, and an output terminal coupled to a terminal of the charge pump.

In one embodiment, the at least one terminal is characterized as being a control gate. In another embodiment, the charge storage region comprises one of a floating gate, nitride, nanocrystals, and a combination of nitride and nanocrystals.

In another embodiment, an integrated circuit comprises a plurality of non-volatile memory cells, a discharge circuit, and a ramp rate control circuit. Each memory cell of the plurality or array of non-volatile memory cells includes a charge storage region and a plurality of terminals. The discharge circuit couples to at least one of the plurality of terminals, the discharge circuit for reducing a predetermined voltage at the at least one terminal following an erase operation of the plurality of non-volatile memory cells. The ramp rate control circuit comprises a capacitor and a bandgap generated current source. The capacitor includes a first plate electrode coupled to at least one terminal of the plurality of terminals, and a second plate electrode. The bandgap generated current source is configured for providing a reference current to determine a ramp rate of the predetermined voltage. The ramp rate control circuit further comprises a first transistor, a second transistor, a comparator, a counter circuit, and a discharge circuit. The first transistor includes a first current electrode coupled to a first power supply voltage terminal, and a second current electrode coupled to the bandgap generated current source. The second transistor includes a first current electrode coupled to the first power supply voltage terminal, and a second current electrode. The comparator includes a first input coupled to the second current electrode of the first transistor, a second input coupled to both the second current electrode of the second transistor and to the second plate electrode of the capacitor, and an output terminal. The counter circuit includes a control terminal coupled to the output terminal of the comparator, and a plurality of output terminals for providing a count value to a plurality of input terminals of the discharge circuit. The discharge circuit couples to the plurality of output terminals of the counter circuit, the discharge circuit for reducing the voltage at the ramp rate. In a further embodiment, the discharge circuit comprising a plurality of transistors, each of the plurality of transistors coupled to a corresponding one of the plurality of output terminals, wherein a current carrying ability of the plurality transistors is proportional to the count value.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit, comprising:
  a plurality of non-volatile memory cells, each memory cell of the array having a charge storage region and a plurality of terminals; and
  a ramp rate control circuit, coupled to control a discharge system, comprising:
  a capacitor having a first plate electrode coupled to at least one terminal of the plurality of terminals, and a second plate electrode;
  a bandgap generated current source for providing a reference current to determine a ramp rate of a voltage at the at least one terminal; and a counter coupled to respond to the reference current, the counter configured for discharging the at least one terminal at the ramp rate.

2. The integrated circuit of claim 1, wherein the at least one terminal is a control gate, and the voltage is provided by a charge pump during a programming operation of the plurality of non-volatile memory cells.

3. The integrated circuit of claim 1, wherein the voltage is discharged from the at least one terminal at the ramp rate, wherein the voltage is discharged following an erase operation of the plurality of non-volatile memory cells.

4. The integrated circuit of claim 1, further comprising a charge system having a charge pump for providing the voltage to the at least one terminal.

5. The integrated circuit of claim 1, wherein the ramp rate control circuit further comprises an inverter, the inverter having an input terminal coupled to both the bandgap generated current source and to the second plate electrode of the capacitor, the inverter having an output terminal coupled to a terminal of a charge pump, the charge pump for providing the voltage at the ramp rate.

6. The integrated circuit of claim 1, wherein the ramp rate control circuit further comprises:
   a first transistor having a first current electrode coupled to a first power supply voltage terminal, and a second current electrode coupled to the bandgap generated current source;
   a second transistor having a first current electrode coupled to the first power supply voltage terminal, and a second current electrode; and
   a comparator having a first input coupled to the second current electrode of the first transistor, a second input coupled to both the second current electrode of the second transistor and to the second plate electrode of the capacitor, and an output terminal coupled to a terminal of a charge pump for providing the voltage at the ramp rate.

7. The integrated circuit of claim 1, wherein the ramp rate control circuit further comprises:
   a first transistor having a first current electrode coupled to a first power supply voltage terminal, and a second current electrode coupled to the bandgap generated current source;
   a second transistor having a first current electrode coupled to the first power supply voltage terminal, and a second current electrode;
   a comparator having a first input coupled to the second current electrode of the first transistor, a second input coupled to both the second current electrode of the second transistor and to the second plate electrode of the capacitor, and an output terminal;
   a counter circuit having a control terminal coupled to the output terminal of the comparator, and a plurality of output terminals for providing a count value; and
   a discharge circuit coupled to the plurality of output terminals of the counter circuit, the discharge circuit for reducing the voltage at the ramp rate.

8. The integrated circuit of claim 7, wherein the discharge circuit comprising a plurality of transistors, each of the plurality of transistors coupled to a corresponding one of the plurality of output terminals, wherein a current carrying ability of the plurality transistors is proportional to the count value.

9. The integrated circuit of claim 1, wherein the plurality of terminals comprises a control gate, a drain, a source, and a well terminal.

10. The integrated circuit of claim 1, wherein the charge storage region comprises one of a floating gate, nitride, nanocrystals, and a combination of nitride and nanocrystals.

11. An integrated circuit, comprising:
   a plurality of non-volatile memory cells, each memory cell of the array having a charge storage region and a plurality of terminals;
   a charge pump having an output terminal coupled to at least one of the plurality of terminals, the charge pump for providing a predetermined voltage during a programming operation of the plurality of non-volatile memory cells; and
   a ramp rate control circuit, comprising:
      a capacitor having a first plate electrode coupled to the at least one terminal of the plurality of terminals, and a second plate electrode;
      a bandgap generated current source for providing a reference current to determine a ramp rate of the predetermined voltage at the at least one terminal; and
      an inverter having an input terminal coupled to both the bandgap generated current source and to the second plate electrode of the capacitor, the inverter having an input terminal coupled to a terminal of the charge pump, the charge pump for providing the voltage at the ramp rate.

12. The integrated circuit of claim 11, wherein the ramp rate control circuit further comprises:
   a first transistor having a first current electrode coupled to a first power supply voltage terminal, and a second current electrode coupled to the bandgap generated current source;
   a second transistor having a first current electrode coupled to the first power supply voltage terminal, and a second current electrode; and
   a comparator having a first input coupled to the second current electrode of the first transistor, a second input coupled to both the second current electrode of the second transistor and to the second plate electrode of the capacitor, and an output terminal coupled to a terminal of the charge pump.

13. The integrated circuit of claim 11, wherein the at least one terminal is characterized as being a control gate.

14. The integrated circuit of claim 11, wherein the charge storage region comprises one of a floating gate, nitride, nanocrystals, and a combination of nitride and nanocrystals.

15. An integrated circuit, comprising:
   a plurality of non-volatile memory cells, each memory cell of the array having a charge storage region and a plurality of terminals;
   a discharge circuit coupled to at least one of the plurality of terminals, the discharge circuit for reducing a predetermined voltage at the at least one terminal following an erase operation of the plurality of non-volatile memory cells; and
   a ramp rate control circuit, comprising:
      a capacitor having a first plate electrode coupled to at least one terminal of the plurality of terminals, and a second plate electrode;
      a bandgap generated current source for providing a reference current to determine a ramp rate of the predetermined voltage; and
      a comparator having a first input coupled to the bandgap generated current source, a second input coupled to the second plate electrode of the capacitor, and an output terminal coupled to control the discharge circuit.

16. The integrated circuit of claim 15, wherein the ramp rate control circuit further comprises:

a first transistor having a first current electrode coupled to a first power supply voltage terminal, and a second current electrode coupled to the bandgap generated current source;

a second transistor having a first current electrode coupled to the first power supply voltage terminal, and a second current electrode coupled to the second current electrode of the first transistor;

a counter circuit having a control terminal coupled to the output terminal of the comparator, and a plurality of output terminals for providing a count value to a plurality of input terminals of the discharge circuit; and the discharge circuit coupled to the plurality of output terminals of the counter circuit, the discharge circuit for reducing the voltage at the ramp rate.

17. The integrated circuit of claim 16, wherein the discharge circuit comprising a plurality of transistors, each of the plurality of transistors coupled to a corresponding one of the plurality of output terminals, wherein a current carrying ability of the plurality transistors is proportional to the count value.

18. The integrated circuit of claim 15, wherein the plurality of terminals comprises a control gate, a drain, a source, and a well terminal.

19. The integrated circuit of claim 15, wherein the charge storage region comprises one of a floating gate, nitride, nanocrystals, and a combination of nitride and nanocrystals.

* * * * *